United States Patent
Kautzsch et al.

(10) Patent No.: US 10,683,203 B2
(45) Date of Patent: Jun. 16, 2020

(54) MICROELECTROMECHANICAL DEVICE, METHOD FOR MANUFACTURING A MICROELECTROMECHANICAL DEVICE, AND METHOD FOR MANUFACTURING A SYSTEM ON CHIP USING A CMOS PROCESS

(71) Applicant: Infineon Technologies Dresden GmbH, Dresden (DE)

(72) Inventors: Thoralf Kautzsch, Dresden (DE); Steffen Bieselt, Stadt Wehlen (DE); Heiko Froehlich, Radebeul (DE); Andre Roeth, Dresden (DE); Maik Stegemann, Pesterwitz (DE); Mirko Vogt, Dresden (DE)

(73) Assignee: Infineon Technologies Dresden GmbH (DE)

( * ) Notice: Subject to any disclaimer, the term of this patent is extended or adjusted under 35 U.S.C. 154(b) by 90 days.

(21) Appl. No.: 15/951,489

(22) Filed: Apr. 12, 2018

(65) Prior Publication Data
US 2018/0297838 A1     Oct. 18, 2018

(30) Foreign Application Priority Data
Apr. 13, 2017   (DE) ................. 10 2017 206 412

(51) Int. Cl.
*H01L 21/00*   (2006.01)
*B81B 7/02*   (2006.01)
(Continued)

(52) U.S. Cl.
CPC ............... *B81B 7/02* (2013.01); *B81B 5/00* (2013.01); *B81C 1/00047* (2013.01);
(Continued)

(58) Field of Classification Search
CPC ................................................ B81B 7/02; B81B 5/00; B81C 1/0047; B81C 1/00166; B81C 1/00246
See application file for complete search history.

(56) References Cited

U.S. PATENT DOCUMENTS

2009/0199637 A1   8/2009   Kazuhiko
2010/0186511 A1   7/2010   Kautzsch et al.
(Continued)

FOREIGN PATENT DOCUMENTS

| DE | 10 2008 063 422 A1 | 8/2009 |
| DE | 10 2008 042 350 A1 | 4/2010 |
| DE | 10 2009 055 389 A1 | 8/2010 |

*Primary Examiner* — Richard A Booth
(74) *Attorney, Agent, or Firm* — Design IP

(57) ABSTRACT

A microelectromechanical systems (MEMS) device is provided and includes a bulk semiconductor substrate, a cavity formed in the bulk semiconductor substrate, a movably suspended mass, a cap structure and a capacitive structure is shown. The movably suspended mass is defined in the bulk semiconductor substrate by one or more trenches extending from a main surface area of the bulk semiconductor substrate to the cavity. The cap is structure arranged on the main surface area of the bulk semiconductor substrate. The capacitive structure comprises a first electrode structure arranged on the movably suspended mass and a second electrode structure arranged at the cap structure such that the first electrode structure and the second electrode structure are spaced apart in a direction perpendicular to the main surface area of the bulk semiconductor substrate.

18 Claims, 9 Drawing Sheets

(51) Int. Cl.
*B81B 5/00* (2006.01)
*B81C 1/00* (2006.01)

(52) U.S. Cl.
CPC ...... *B81C 1/00166* (2013.01); *B81C 1/00246* (2013.01); *B81B 2201/0235* (2013.01); *B81B 2203/033* (2013.01); *B81B 2203/0315* (2013.01); *B81B 2203/04* (2013.01); *B81B 2203/051* (2013.01); *B81B 2207/015* (2013.01); *B81B 2207/095* (2013.01); *B81C 2203/0714* (2013.01)

(56) References Cited

U.S. PATENT DOCUMENTS

| | | |
|---|---|---|
| 2011/0221455 A1 | 9/2011 | Feyh |
| 2016/0187370 A1 | 6/2016 | Ikehashi |
| 2016/0289063 A1* | 10/2016 | Ocak .................... B81B 7/0048 |

* cited by examiner

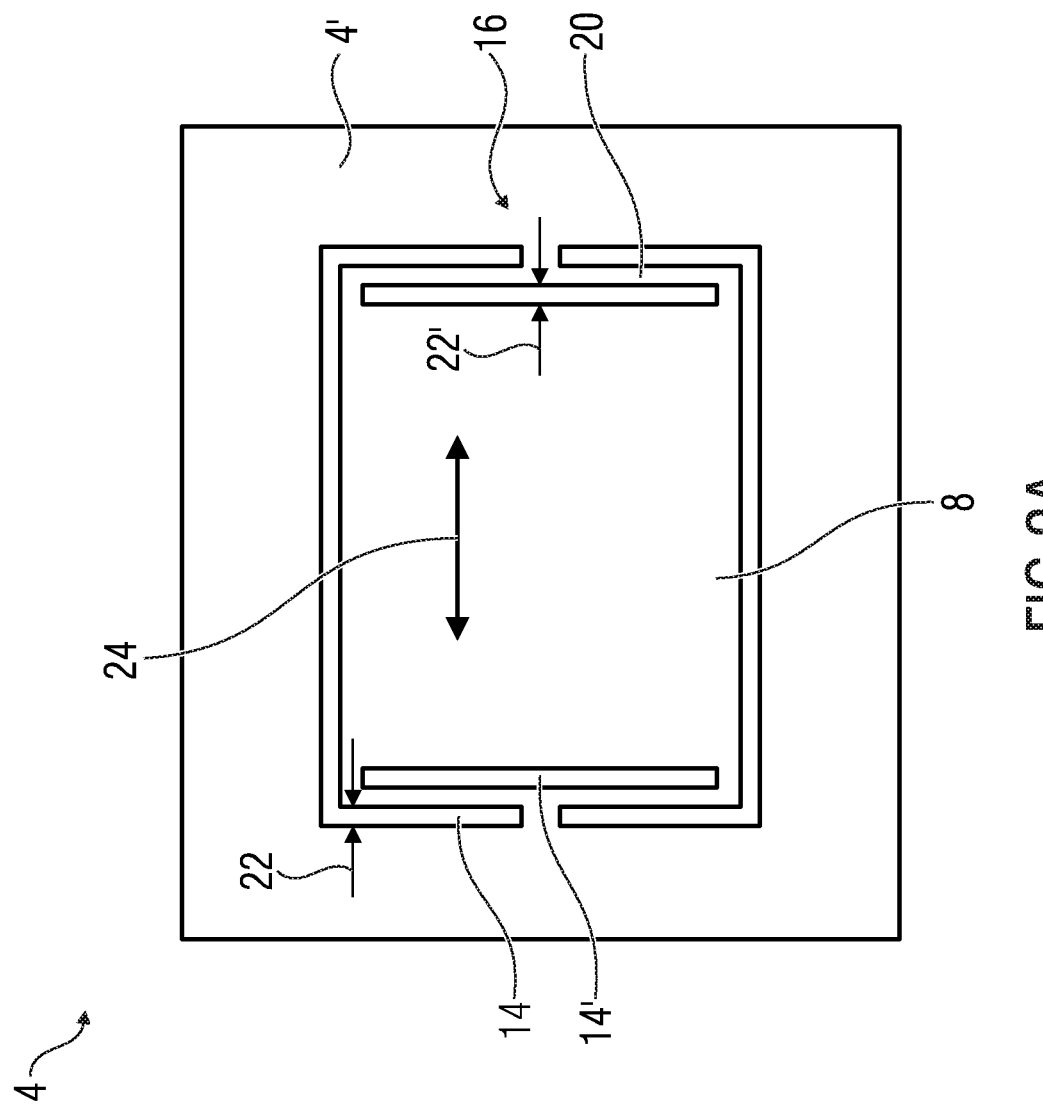

1. Silicon-on-Nothing Process

2. Deep Trench and Carbon Sealing

3. Poly Inlay, Carbon and 2$^{nd}$ Poly Deposition

4. Carbon Deposition/Structuring and Oxide Deposition

5. Carbon Removal and Wiring

MICROELECTROMECHANICAL DEVICE, METHOD FOR MANUFACTURING A MICROELECTROMECHANICAL DEVICE, AND METHOD FOR MANUFACTURING A SYSTEM ON CHIP USING A CMOS PROCESS

FIELD

This disclosure relates in general to a microelectromechanical systems (MEMS) device, a method for manufacturing a MEMS device, and a method for manufacturing a system on chip using a complementary metal-oxide-semiconductor (CMOS) process.

BACKGROUND

Microelectromechanical systems (MEMS) devices (e.g., acceleration sensors) may be mass products of automotive and consumer durable electronics. Among others things, systems are desired which integrate a simple threshold switch into an ASIC (application-specific integrated circuit). Such a system is used e.g., in TPMS (tire-pressure monitoring system) sensors.

In the migration into more recent technology nodes, there is the challenge of integrating these systems such that the complexity of a complementary metal-oxide-semiconductor (CMOS) process is not unnecessarily augmented and that the existing integration scheme of the CMOS circuit can be largely maintained with as little development expenditure as possible.

In technologies involving structural widths of, for example, 130 nm and below, the topology of the front-end-of-line structures, for example, plays an important part. They should not exceed an overall thickness of several hundred nanometers so as not to negatively affect the borophosphosilicate glass (BPSG) polishing step, which is often performed.

In addition, reduction to as few additional steps as possible and joint utilization of existing processes are prerequisites for successful integration.

Besides the CMOS compatibility, it is also desirable to form the MEMS devices with a decreasing frame size without reducing the sensitivity of the sensors.

SUMMARY

Embodiments provide a MEMS device including a movably suspended mass (or seismic mass) defined in a semiconductor substrate having a first electrode structure arranged on the movably suspended mass and a second electrode structure arranged at the cap structure such that the first and the second electrode structure form a capacitive structure.

Embodiments provide a MEMS device including a bulk semiconductor substrate, a cavity formed in the bulk semiconductor substrate, a movably suspended mass, a cap structure and a capacitive structure. The movably suspended mass is defined in the bulk semiconductor substrate by one or more trenches extending from a main surface area of the bulk semiconductor substrate to the cavity. The cap is structure arranged on the main surface area of the bulk semiconductor substrate. The capacitive structure includes a first electrode structure arranged on the movably suspended mass and a second electrode structure arranged at the cap structure such that the first electrode structure and the second electrode structure are spaced apart in a direction perpendicular to the main surface area of the bulk semiconductor substrate.

Further embodiments provide a method for manufacturing a MEMS device including the following steps: forming a cavity in a bulk semiconductor substrate, defining a movably suspended mass in the bulk semiconductor substrate by one or more trenches extending from a main surface area of the bulk semiconductor substrate to the cavity and arranging a cap structure on the main surface area of the bulk semiconductor substrate. The forming of the capacitive structure includes arranging a first electrode structure on the movably suspended mass and attaching a second electrode structure to the cap structure such that the first electrode structure and the second electrode structure are spaced apart in a direction perpendicular to the main surface area of the bulk semiconductor substrate.

Further embodiments provide a method for manufacturing a system on chip using a CMOS process, wherein the system on chip includes a MEMS device and a control circuit to read out the MEMS device. The method includes the steps the method for manufacturing a MEMS device according to the preceding embodiments to form the MEMS device. At least one of these steps simultaneously performs a step of manufacturing the control circuit.

Thus, embodiments provide a concept for improving MEMS systems with a capacitive structure. The proposed concept is CMOS integrable, i.e., the manufacturing steps may be formed during typical CMOS processes and may therefore affect the manufacturing of present CMOS circuits (e.g. systems on a chip) only to a minor extend. Additionally, the distance between the first and the second electrode structure may be arbitrarily chosen, which is not possible in conventional capacitive MEMS devices due to manufacturing restrictions. For example, in conventional systems, a sacrificial layer defining the distance between the two electrode structures also seals (or covers/closes) the trenches in the semiconductor substrate defining the movably suspended mass. Hence, the sacrificial layer (or at least the portion covering the trenches) needs a minimum thickness as to obtain a suitable stability (or robustness) to withstand further processing steps. Using the manufacturing method according to this disclosure, the sacrificial layer defining the distance (or gap) between the first and the second electrode structure has no further purpose than defining this gap. Thus, the distance is freely scalable and may be therefore chosen to be extremely small as to improve the sensitivity of the MEMS device. In other words, a substantial degree of freedom is generated via a separate structuring process for each of both electrodes, for the purpose of miniaturization and functional extension.

According to embodiments, the MEMS device includes a third electrode structure arranged at the cap structure such that the first electrode structure and the third electrode structure are spaced apart in a direction perpendicular to the main surface area of the bulk semiconductor substrate. This enables a read out circuit to differentially read out the capacitance or a change of capacitance of the MEMS device. Hence, for example, a projection of the second and the third electrode structure perpendicular to the main surface area partially overlaps with the first electrode structure.

Using this arrangement of the electrodes, a capacity of the first and the second electrode structure changes reversely when compared to the capacity of the first and the third electrode structures. For example the read out circuit is connected to the first electrode structure to differentially sense a capacitance between the first and the second electrode structure and a capacitance between the first and the third electrode structure. In embodiments, the read out circuit for differentially reading-out the second electrode structure and the third electrode structure may be part of the MEMS device. Thus, in further embodiments, the read out circuit and the MEMS device may be manufactured using a common CMOS process.

Embodiments show the method for manufacturing including depositing an intermediate sacrificial layer on the first electrode structure. In a further step, a second electrode structure material is deposited on the intermediate sacrificial layer. Additionally, the second electrode structure material is structured to form a second electrode structure. Thus, when depositing the intermediate sacrificial layer above the first electrode structure, at least this portion (the portion above the first electrode structure) of the intermediate sacrificial layer may have an arbitrarily chosen thickness (or width, measured in a direction perpendicular to the main surface area, i.e. measured in growing (during deposition) direction. Once the second (and optionally a third) electrode structure is deposited on the intermediate sacrificial layer, the thickness of the intermediate sacrificial layer defines the gap distance between the first electrode structure and the second (and optionally third) electrode structure

BRIEF DESCRIPTION OF THE DRAWINGS

Embodiments are described herein making reference to the appended drawings and figures.

FIG. 2a shows a schematic top view on an exemplary bulk semiconductor substrate and the movably suspended mass;

FIGS. 7a-7e show schematic cross-sectional views of a MEMS device at various processing steps, in which FIGS. 7a to 7d show schematic cross-sectional views of intermediate MEMS devices after a corresponding processing step resulting in a final MEMS device shown in FIG. 7e.

Before discussing embodiments in further detail using the drawings, it is pointed out that in the figures and in the specification identical elements and elements having the same functionality and/or the same technical or physical effect, are usually provided with the same reference numbers or are identified with the same name, so that the description of these elements and of the functionality thereof as illustrated in the different embodiments are mutually exchangeable or may be applied to one another in the different embodiments.

Embodiments as illustrated in the following relate to a MEMS device. The MEMS device is provides a suspended mass which is formed from semiconductor material of the MEMS device. The suspended mass is moveable with respect to other structures of the MEMS device. According to embodiments, the MEMS device is configured to convert such mechanical movement to electric signals, e.g. by measuring a capacitance of the MEMS device.

The MEMS device may for example correspond to an electromechanical accelerometer, in which movement of the suspended mass may be detected on the basis of capacitive coupling of an electrode (first electrode element) on the suspended mass to a counter-electrode (second electrode element). Further, the MEMS device may correspond to an energy harvester, in which movement of the suspended mass may be converted to electric energy by utilizing electrostatic coupling of an electrode on the suspended mass to a counter-electrode.

DETAILED DESCRIPTION

In the following description, embodiments are discussed in detail, however, it should be appreciated that the embodiments provide many applicable concepts that can be embodied in a wide variety of specific semiconductor devices which can be capacitively read out, such as capacitive microelectromechanical systems (MEMS) devices. The specific embodiments discussed are merely illustrative of specific ways to make and use the present concept and do not limit the scope. In the following description of embodiments, the same or similar elements having the same function have associated therewith the same reference signs or the same name, and a description for such elements will not be repeated for every embodiment. Moreover, features of the different embodiments as described herein may be combined with each other, unless specifically noted otherwise.

Figure 1:
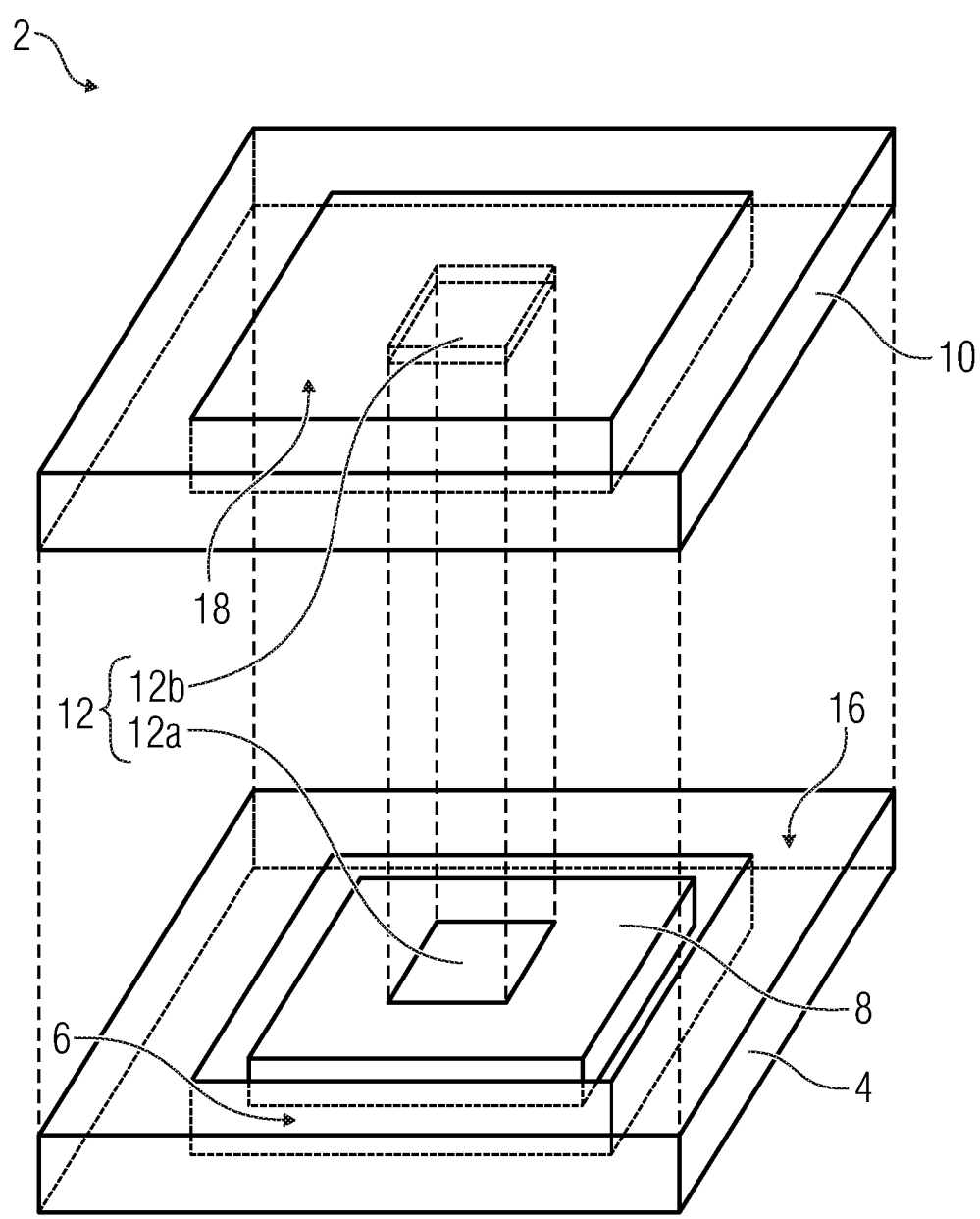
FIG. 1 shows a schematic perspective view on a microelectromechanical device according to embodiments.

FIG. 1 shows a schematic perspective view on a microelectromechanical device 2 according to embodiments. The MEMS device 2 comprises a bulk semiconductor substrate 4, a cavity 6, a movably suspended mass 8, a cap structure 10, and a capacitive structure 12.

The cavity 6 is formed in the bulk semiconductor substrate 4, e.g. using a silicon on nothing process. The movably suspended mass 8 is defined in the bulk semiconductor substrate 4 by one or more trenches 14 extending from a main surface area 16 of the bulk semiconductor substrate 4 to the cavity 6. Hence, the cavity 6 may be formed beneath a main surface area 16 of the semiconductor substrate 4 in a region of the future movably suspended mass 8. The trenches 14 may be etched into the semiconductor substrate 4. A more detailed view on the trenches 14 is provided with respect to FIG. 2.

The bulk semiconductor substrate may comprise e.g. monocrystalline silicon (single crystal silicon). The bulk semiconductor substrate may be n- or p-doped. By doping the semiconductor substrate using n- or p-type charge carriers, a (intrinsic) conductivity may be obtained. The movably suspended mass 8 is formed from the semiconductor substrate 4. The movably suspended mass 8 corresponds to a part of the semiconductor substrate 4 which covers the cavity 18.

The cap structure 10 (or bearing structure, support structure) is arranged on the main surface area 16 of the bulk semiconductor substrate 4. In other words, the cap structure may be arranged on a remaining portion of the semiconductor substrate. The cap structure 10 may not (mechanically) contact the movably suspended mass 8. In other words, the cap structure 10 is spaced apart from the movably suspended mass 8.

The capacitive structure 12 comprises a first electrode structure 12a and a second electrode structure 12b. The first electrode structure 12a is arranged on the movably suspended mass 8 and the second electrode structure 12*b* is arranged at the cap structure such that the first electrode structure 12*a* and the second electrode structure 12*b* are spaced apart in a direction perpendicular to the main surface area 16 of the bulk semiconductor substrate 4. FIG. 1 shows that the first electrode structure 12*a* is arranged directly opposite to the second electrode structure 12*b*, i.e. that a projection of the first electrode structure perpendicular to the main surface area completely falls in the second electrode structure and/or vice versa. However, further embodiments with respect to subsequent figures also reveal that the first and the second electrode structure only partially overlap.

To hold (or bear, support) the second electrode structure above the movably suspended mass, the cap structure may comprise a recess 18 in the area of the movably suspended mass. Thus, the second electrode structure may be arranged at the cap structure within the recess 18. The cap structure may have a typical thickness (or height) of between 300 nm and 10 µm, between 500 nm and 5 µm, or between 750 nm and 1.2 µm. In other words, the typical thickness may be below 10 µm, below 5 µm, below 1 µm or below 500 nm. A minimum thickness may be greater or equal to 300 nm. In further other words, the typical thickness may be greater or equal to 300 nm, greater or equal to 500 nm, or greater or equal to 1 µm. A maximum thickness may be smaller or equal to 10 µm.

To arrange the first electrode structure 12*a* on the movably suspended mass 8, the semiconductor substrate 4 may be structured, e.g. using etching parts of the semiconductor substrate defined by a lithography mask, such that a portion (or layer) of the semiconductor substrate is (partially) removed, leaving the first electrode structure. Another option to form the first electrode structure is the deposition of an electrode structure material, e.g. in structures of a structured sacrificial layer. The electrode structure material may comprise a (electrically) conductive material such as polycrystalline silicon, a metal, or (highly) doped amorphous silicon (aSi) that may be deposited using a suitable coating such as chemical vapor deposition (CVD). In other words, the first electrode structure 12*a* is located on that part of the semiconductor substrate that corresponds to the movably suspended mass 8.

The first electrode structure may have a typical thickness (or height) of between 30 nm and 500 nm, between 70 nm and 250 nm, or between 100 nm and 200 nm. In other words, the typical thickness may be below 500 nm, below 300 nm, below 150 nm or below 80 nm. A minimum thickness may be greater or equal to 30 nm. In further other words, the typical thickness may be greater or equal to 30 nm, greater or equal to 100 nm, or greater or equal to 200 nm. A maximum thickness may be smaller or equal to 500 nm.

The first electrode structure may have a typical lateral extension (or length/width) of between 500 nm and 5 µm, between 750 nm and 2.5 µm, or between 1 µm and 2 µm. In other words, the typical lateral extension may be below 5 µm, below 2.5 µm, below 1 µm or below 750 nm. A minimum lateral extension may be greater or equal to 500 nm. In further other words, the typical lateral extension may be greater or equal to 500 nm, greater or equal to 750 nm, greater or equal to 1 µm, or greater or equal to 2.5 µm. A maximum lateral extension may be smaller or equal to 5 µm. The lateral extension may be measured in parallel to the main surface area of the semiconductor substrate.

To arrange the second electrode structure at the cap structure, an electrode structure material may be deposited on a sacrificial layer above (seen from the main surface area of the semiconductor substrate) the first electrode structure. The electrode structure material may be structured to form the second electrode structure. The electrode structure material may comprise a material of the cap structure or a different conductive material such as a metal or polycrystalline silicon. The polycrystalline silicon may be doped to achieve a desired conductivity of the second electrode structure.

The second electrode structure may have a typical thickness (or height) of between 30 nm and 500 nm, between 70 nm and 250 nm, or between 100 nm and 200 nm. In other words, the typical thickness may be below 500 nm, below 300 nm, below 150 nm or below 80 nm. A minimum thickness may be greater or equal to 30 nm. In further other words, the typical thickness may be greater or equal to 30 nm, greater or equal to 100 nm, or greater or equal to 200 nm. A maximum thickness may be smaller or equal to 500 nm.

The second electrode structure may have a typical lateral extension (or length/width) of between 500 nm and 5 µm, between 750 nm and 2.5 µm, or between 1 µm and 2 µm. In other words, the typical lateral extension may be below 5 µm, below 2.5 µm, below 1 µm or below 750 nm. A minimum lateral extension may be greater or equal to 500 nm. In further other words, the typical lateral extension may be greater or equal to 500 nm, greater or equal to 750 nm, greater or equal to 1 µm, or greater or equal to 2.5 µm. A maximum lateral extension may be smaller or equal to 5 µm. The lateral extension may be measured in parallel to the main surface area of the semiconductor substrate.

FIG. 2*a* shows a schematic top view on an exemplary bulk semiconductor substrate and the movably suspended mass 8 (the first electrode structure arranged on the movably suspended mass is not shown). The definition of the movably suspended mass 8 within the semiconductor substrate 4 is provided via one or more trenches 14. The portion of the semiconductor substrate that is not part of the movably suspended mass 8 may be referred to as remaining portion of the semiconductor substrate 4'.

According to embodiments, a mechanical contact between the movably suspended mass 8 and the remaining portion of the bulk semiconductor substrate 4' may be achieved by spring elements 20. The spring elements 20 may comprise the same material than the movably suspended mass 8 and the remaining portion of the semiconductor substrate 4'. The spring elements 20 may be defined by the trenches 14 separating the movably suspended mass from the remaining portion of the semiconductor substrate and by further trenches 14'. The further trenches 14' may be arranged in the movably suspended mass, such that the spring elements are part of the movably suspended mass. In other words, the spring elements 20 may be formed from a portion of the semiconductor substrate related to the movably suspended mass.

In further other words, the movably suspended mass 8 is a part of the semiconductor substrate 4. Laterally, the movably suspended mass 8 is partially separated by the trenches from the rest 4' of the semiconductor substrate 4. Vertically, the movably suspended mass is separated by the cavity 6 from the semiconductor substrate 4. The lateral separation of the movably suspended mass from the rest 4' of the semiconductor substrate is not continuous, so that one or more springs 20 (suspension structures) are formed through which the movably suspended mass is connected to the rest of the semiconductor substrate. Accordingly, the movably suspended mass is moveable by elastic deformation of the springs. The springs may be designed according to desired movement characteristics, meaning a maximum available amplitude (or an operating range), or a moving direction, of the movably suspended mass. In the illustrated example, the movably suspended mass is assumed to be movable in a lateral direction, as indicated by a double-headed arrow 24. The lateral direction extends parallel to the main surface area of the semiconductor substrate. The maximum available amplitude may refer to the distance, the movably suspended mass can maximally move. This distance is smaller or equal to the sum of the smallest width of any of the trenches and the further trenches defining the spring element in one moving direction and the smallest width of any of the trenches and the further trenches defining the spring element in the opposite (or the other) moving direction.

A lateral extension (width) of the trenches 14 measured in parallel to the main surface area 16 of the semiconductor substrate 4 may have a size of between 100 nm and 1 μm, between 250 nm and 750 nm, or between 400 nm and 600 nm. In other words, the typical lateral extension may be below 250 nm, below 500 nm, below 7500 nm, or below 1 μm. A minimum lateral extension may be greater or equal to 100 nm. In further other words, the typical lateral extension may be greater or equal to 100 nm, greater or equal to 250 nm, greater or equal to 500 nm, or greater or equal to 750 nm. A maximum lateral extension may be smaller or equal to 1 μm.

The extension is depicted by arrows 22. As indicated, the extension may refer to a width of the trenches in moving direction or to a width of the trenches perpendicular to the spring element 20 and/or in parallel to the main surface area 16 of the semiconductor substrate. The moving direction 24 may refer to a dimension (in the sense of a degree of freedom) of the movably suspended mass. In other words, the seismic mass shown in FIG. 2a has one degree of freedom, indicated by the double arrow 24. Thus, the seismic mass may be translated along (or in parallel to) the axis 24 indicated by the degree of freedom, which may be referred to as the (main) moving direction. Thus, the movably suspended mass is configured to move in a direction parallel to the main surface area of the bulk semiconductor substrate. This achieves a reduction of a volume, i.e. a spatial extent of the MEMS device when compared to a volume of a MEMS device having a movably suspended mass moving in a direction perpendicular to the main surface area. Both volumes differ by a factor of 70 according to an exemplary calculation.

The extension of the trenches 14 and the further trenches 14' also affect a maximum movement of the movably suspended mass 8. Thus, if the trenches 14, 14' are undersized, i.e. they do not comprise a width that is sufficient to allow a movement of the movably suspended mass being exposed to a maximum force acting on the MEMS device within the size of the trenches, the risk of hitting the remaining portion of the semiconductor substrate is increased. In other words, to decrease the risk of limiting a range of motion (i.e. a maximum amplitude) of the movably suspended mass by hitting the remaining portion of the semiconductor substrate, the trenches may have a minimum width depending on a maximum desired translation of the movably suspended mass.

To adjust a sensitivity of the MEMS device, a spring stiffness of the spring elements 20 may be varied. The spring stiffness may be set by adjusting (or varying) a width of the spring elements. The width may be defined e.g. by the distance between the one or more trenches 14 and the further trench 14'. A width (or size, lateral extension) of the spring elements may be between 100 nm and 1 μm, between 250 nm and 750 nm, or between 400 nm and 600 nm. In other words, the typical lateral extension may be below 250 nm, below 500 nm, below 7500 nm, or below 1 μm. A minimum lateral extension may be greater or equal to 100 nm. In further other words, the typical lateral extension may be greater or equal to 100 nm, greater or equal to 250 nm, greater or equal to 500 nm, or greater or equal to 750 nm. A maximum lateral extension may be smaller or equal to 1 μm.

Figure 2B:
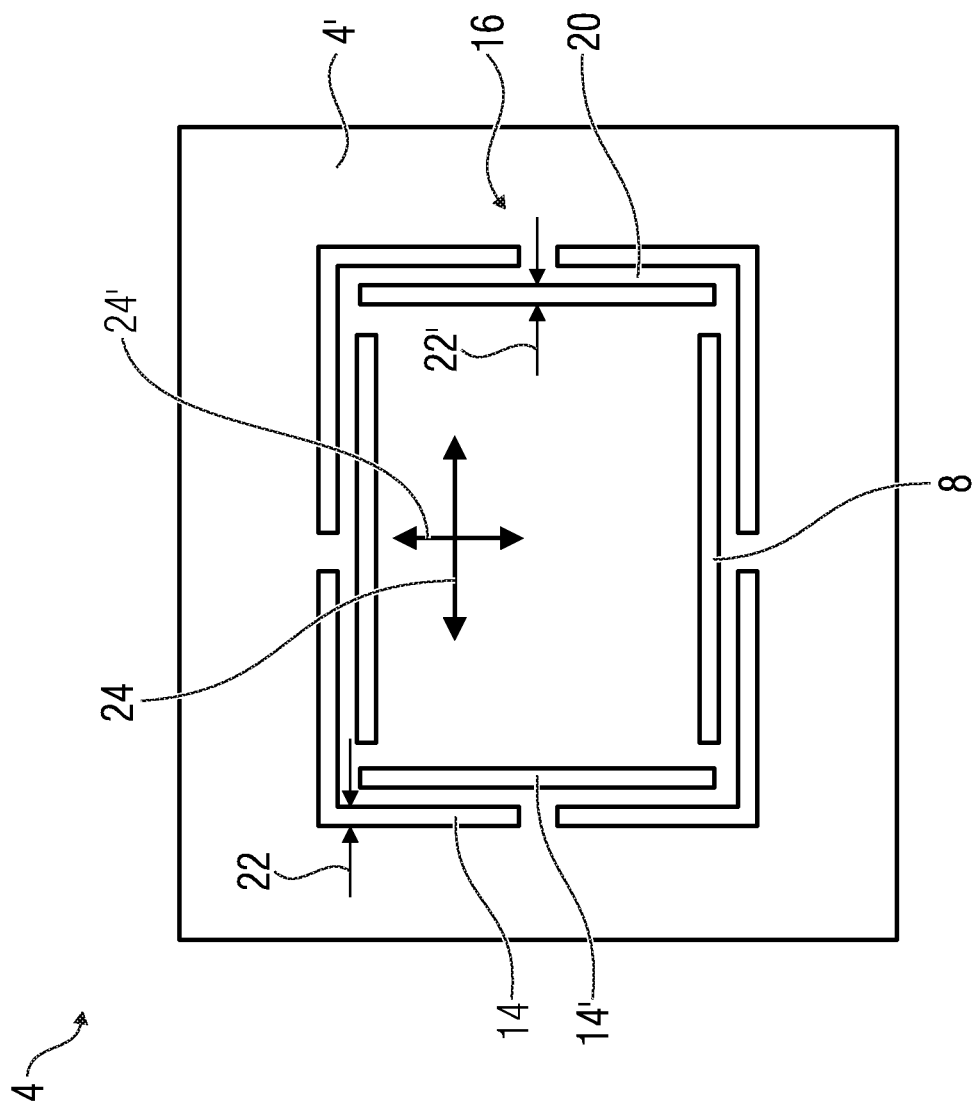
FIG. 2b shows the schematic top view of FIG. 2a with additional spring elements enabling the movably suspended mass to move in a further moving direction.

FIG. 2b shows the embodiment of FIG. 2a with additional spring elements enabling the movably suspended mass to move in a further moving direction 24'. In other words, the movably suspended mass 8 comprises a further degree of freedom enabling a lateral translation in a direction perpendicular to the moving direction 24. Embodiments of FIG. 2b show four trenches 14 defining the movably suspended mass. Using four further trenches 14', four spring elements 20 are formed to allow a movement of the movably suspended mass to allow a movement of the suspended mass within (or parallel to) the plane of the main surface area 16. Furthermore, the description regarding the embodiments of FIG. 2a equally apply to the embodiments of FIG. 2b.

Figure 3:
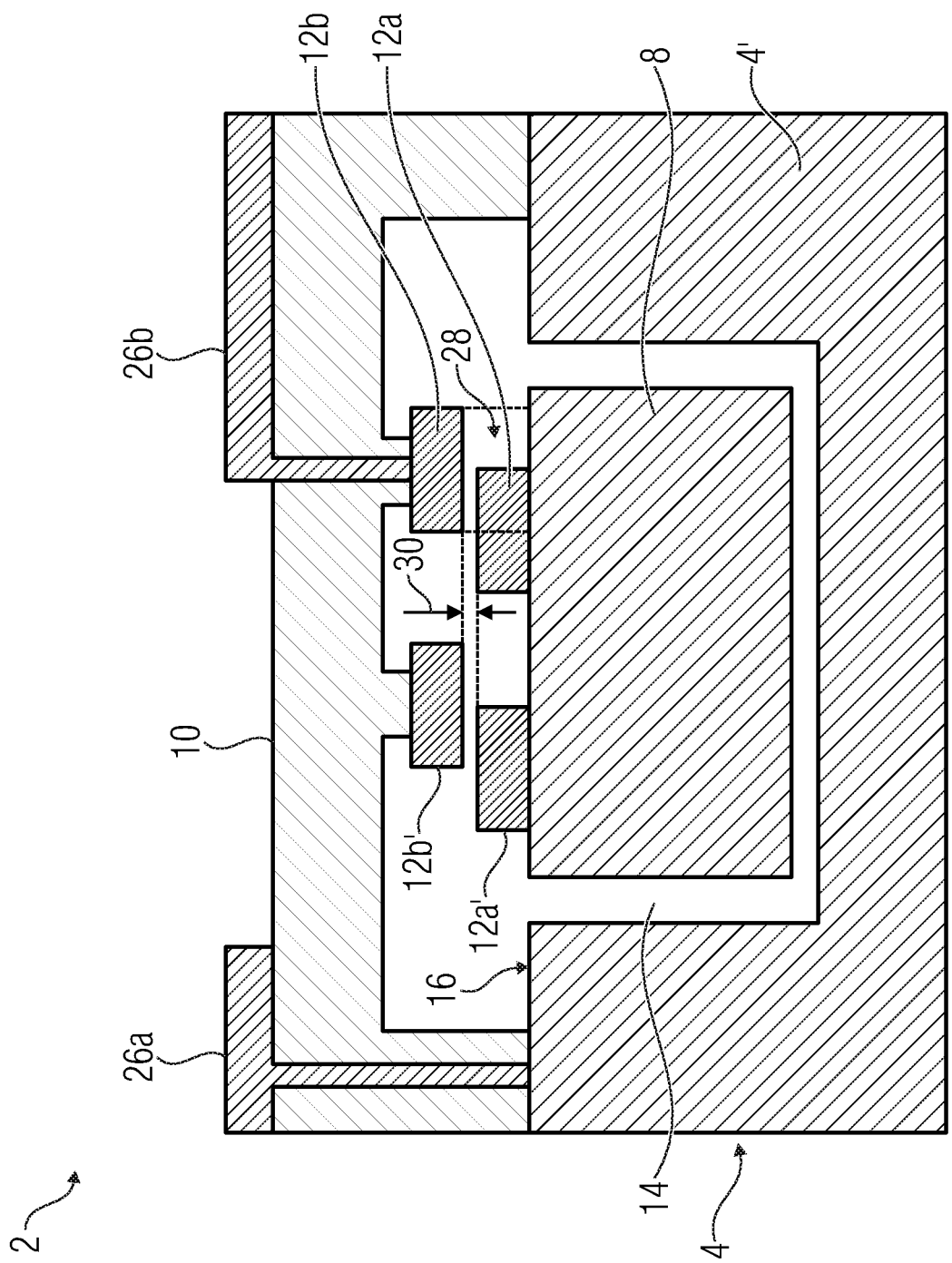
FIG. 3 shows a schematic cross sectional view of the MEMS device 2 comprising separate electrode structures.

FIG. 3 shows a schematic cross sectional view of the MEMS device 2 (e.g., an acceleration sensor) comprising separate electrode structures 12a, 12b. The cap structure 10 is arranged above the semiconductor substrate 4 and attached thereto an the main surface area 16. The cap structure may comprise cap structure material. The cap structure material may be a material, e.g. a material that is used as an inter layer (or level) dielectric (ILD), such as a nitride, e.g. silicon nitride (SiN) or an oxide, e.g. silicon dioxide (SiO). The trenches 14 separate the movably suspended mass 8 from the remaining semiconductor substrate 4'. Contact elements 26a, 26b provide an electrical contact to the semiconductor substrate 4 and the second electrode structure 12b, respectively. The contact elements may comprise a contact element material. The contact element material may be a metal such as tungsten. If the cap structure material comprises an oxide, it is possible to use a sacrificial layer comprising nitride to allow a selective removal of the sacrificial layer to the cap structure. Alternatively, the sacrificial layers may comprise carbon. The sacrificial layers used to manufacture the MEMS device are described with respect to the method for manufacturing the MEMS device in FIG. 6.

According to embodiments, the movably suspended mass is connected to a remaining portion of the bulk semiconductor substrate by the spring elements described with respect to FIGS. 2a and 2b. The spring elements are not shown in FIG. 3. However, the first electrode structure may comprise an electrical connection to the remaining portion of the bulk semiconductor substrate via the spring elements. The electrical connection may be formed by a metal layer electrically connecting the first electrode structure with the remaining portion of the semiconductor substrate. The metal layer may be deposited or placed on the spring elements acting as a bridge over the trenches 14. Alternatively, the electrical connection may be performed by the semiconductor substrate. In this case, the semiconductor substrate may be doped or comprises an intrinsic conductivity such that a sufficient electrical contact is achieved between the first electrode structure and the remaining portion of the semiconductor substrate or more specifically, the electric contact 26a.

Optionally, the first electrode structure 12a is laterally displaced with respect to the second electrode structure 12b. In other words, a projection 28 of the second electrode structure perpendicular to the main surface area of the bulk semiconductor substrate partially overlaps with the first electrode structure or vice versa. This allows for manufacturing the MEMS device such that a function of the capacity between the first and the second electrode structure remains reveals the same monotony throughout the operating range of the MEMS device. In other words, the first and the second electrode structures may be displaced to an extend that, within the operating range, the first and the second electrode structures (always) remain overlapped and the projection of the second electrode structure only partially (and not completely) overlaps the first electrode structure (and vice versa). In this case, a function of the capacity between the first and the second electrode structure within the operating range is quasilinear, i.e. shows the same monotony for the operating range.

According to embodiments, the first electrode structure comprises an electrode structure material. The electrode structure material may be a metal or polycrystalline silicon. The bulk semiconductor substrate comprises a semiconductor substrate material. The semiconductor substrate material may be monocrystalline silicon. Thus, the electrode structure material comprises at least a material structure different from a material structure of the semiconductor substrate material. Alternatively, the semiconductor substrate material may be different from the electrode structure material. The first and the second semiconductor substrate material may optionally be the same.

The cap structure 10 may (hermetically) seal the movably suspended mass 8, the first and the second electrode structure 12a, 12b. In other words, the remaining portion 4' of the semiconductor substrate 4 and the cap structure 10 provide a (hermetically) sealed housing (container) for the active elements of the MEMS device, i.e. the movably suspended membrane and the first and second electrode structure 12a, 12b. The cap structure and the remaining portion of the semiconductor substrate may be mechanically connected in ways that the housing is airtight, i.e. a gas exchange from the inside of the case to the environment of the case is not possible or at least reduced to a minimum gas transfer rate e.g. due to diffusion. Thus, it is possible to maintain a vacuum inside the MEMS device.

The additional electrodes 12a' and 12b' may be part of the first and second electrode structure 12a, 12b respectively. Alternatively, the electrodes 12a', 12b' refer to a further electrode structure. Embodiments with further electrode structures are described with respect to FIG. 4.

In other words, a silicon on nothing cavity may be used in combination with a movable mass using top-side capacitive tapping. The electrodes may be implemented by a material different from that of the substrate. They may be arranged in an offset manner (or may be set up as a differential arrangement). Thus, a silicon on nothing cavity may be combined with an acceleration-sensitive mass (movably suspended mass) integrated into the substrate, wherein the seismic mass and the spring consist of a substrate material, and the electrodes consist of (a) further material(s). Additionally, the first and the second electrode structure (of the top and bottom electrodes) may be arranged by an offset (displacement) as to allow obtaining a merely linear, at least monotonic, characteristic of the capacity between the first and the second electrode structures.

According to embodiments, the first and the second electrode structure are spaced apart by a distance of less than 500 nm, less than 400 nm, less than 300 nm, less than 200 nm, less than 100 nm, less than 80 nm, or less than 60 nm. This is possible due to the manufacturing process described below. A smaller distance results in a better sensitivity of the MEMS device when compared to a greater distance. Thus, the distance between the first and the second electrode structure element may be smaller than a minimum thickness of a sacrificial layer to reliably seal the trenches during the manufacturing process. The sacrificial layer to seal the trenches may comprise a thickness of at least 100 nm as to withstand the further manufacturing processes without opening the trenches.

In other words, the MEMS device such as a discrete acceleration sensor structure does not operate with a polycrystalline silicon lamella produced on the substrate, which only allows to form layers of typically 5 to 10 μm serving as the foundation of a discrete device. In this form, they cannot be integrated into a CMOS process. Furthermore, it is not implemented a structure integrated into the substrate. For a simple threshold switch which outputs, at several ten G (a vehicle wheel valve position reaches said acceleration at 30 km/h), a signal that can be read out, a suitably suspended thin membrane would also suffice. Additionally, an acceleration sensor structure is not integrated into the substrate using e.g. lateral comb structures for capacitive tapping. Neither is used suitably mounted top-side electrodes.

Figure 4:
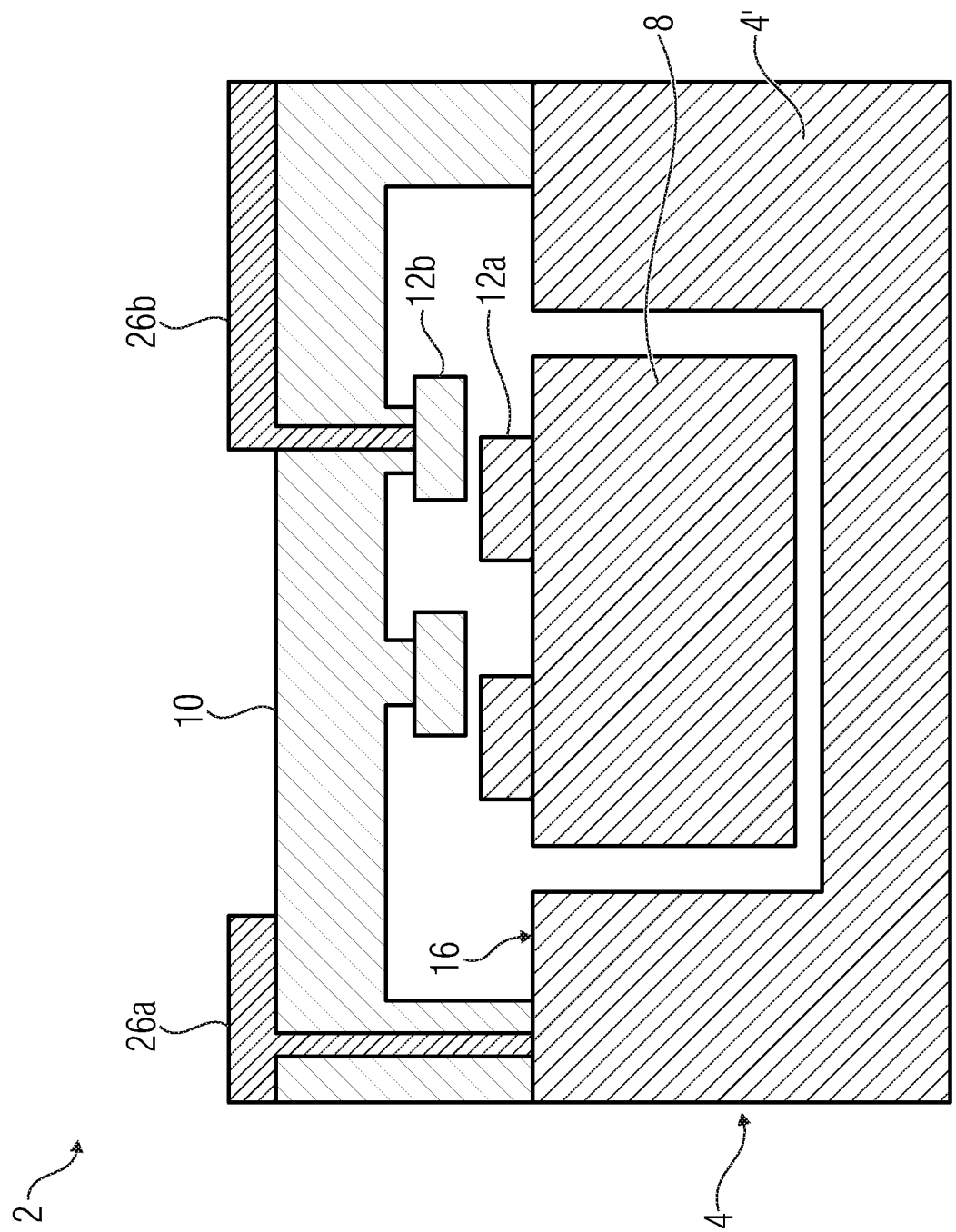
FIG. 4 shows a schematic cross sectional view of the MEMS device with two modifications when compared to the embodiments of FIG. 3 with respect to the structuring of the first and second electrode structure.

FIG. 4 shows a schematic cross sectional view of the MEMS device 2 with two modifications when compared to the embodiments of FIG. 3. However, each modification may be applied separately to the embodiments of FIG. 3. FIG. 4 reveals embodiments of the MEMS device, where the first electrode structure comprises of a material of the semiconductor substrate and/or where the second electrode structure material comprises of a material of the cap structure.

Hence, the first electrode structure comprises an electrode structure material and the bulk semiconductor substrate comprises a semiconductor substrate material. According to the embodiments of FIG. 4, the electrode structure material optionally comprises a material structure different from a material structure of the semiconductor substrate material. This may be the case if the first electrode structure material is doped to obtain a sufficient or desired electric conductivity. If the semiconductor substrate material comprises a sufficient intrinsic conductivity, the material structure may even be the same since an additional doping of the first electrode structure may be omitted, i.e. is not necessary. In other words, the electrode structure material is the semiconductor substrate material wherein optionally, the electrode structure material comprises a higher electrical conductivity when compared to the semiconductor substrate material The second electrode structure may be formed from a material used to form the cap structure. To obtain a conductivity of the second electrode structure, it may be used a material that becomes electrically conductive by doping or any other kind of (CMOS-compatible) processing, but which is naturally (electrically) insulating. Thus, the second electrode structure may be formed from the cap structure material, doped to obtain the electrical conductivity and further arranged at (or attached to) the cap structure material forming the cap structure. Hence, the cap structure material may comprise monocrystalline, polycrystalline, or amorphous silicon. However, it has to be noted that, from a processing perspective, two deposition steps are used to from the electrode structure. One step to deposit a layer of the second electrode structure material (which may be the cap structure material which is processed to be electrically conductive), etching or forming the second electrode structure from the electrode structure material and depositing the (electrically insulating) cap structure material such that the second electrode structure is arranged at the cap structure.

Thus, the electrode structure is not formed in the cap structure. In other words, the electrode structure is arranged in a protrusion (or jut, bulge) at the cap structure. The protrusion may be referred to as the second electrode structure at may thus have the dimensions of the second electrode structure as described above.

Thus the first electrode structure comprises a first electrode structure material and the second electrode structure comprises a second electrode structure material. FIG. 4, for example, reveals that the first electrode structure comprises a material structure different from a material structure of the second electrode structure material. This holds e.g. if one of the first and/or the second electrode structure are of the same material as the semiconductor substrate material or the cap structure material, respectively, but comprise a different doping concentration of a different crystal structure of the material such as monocrystalline silicon and polycrystalline silicon.

Figure 5:
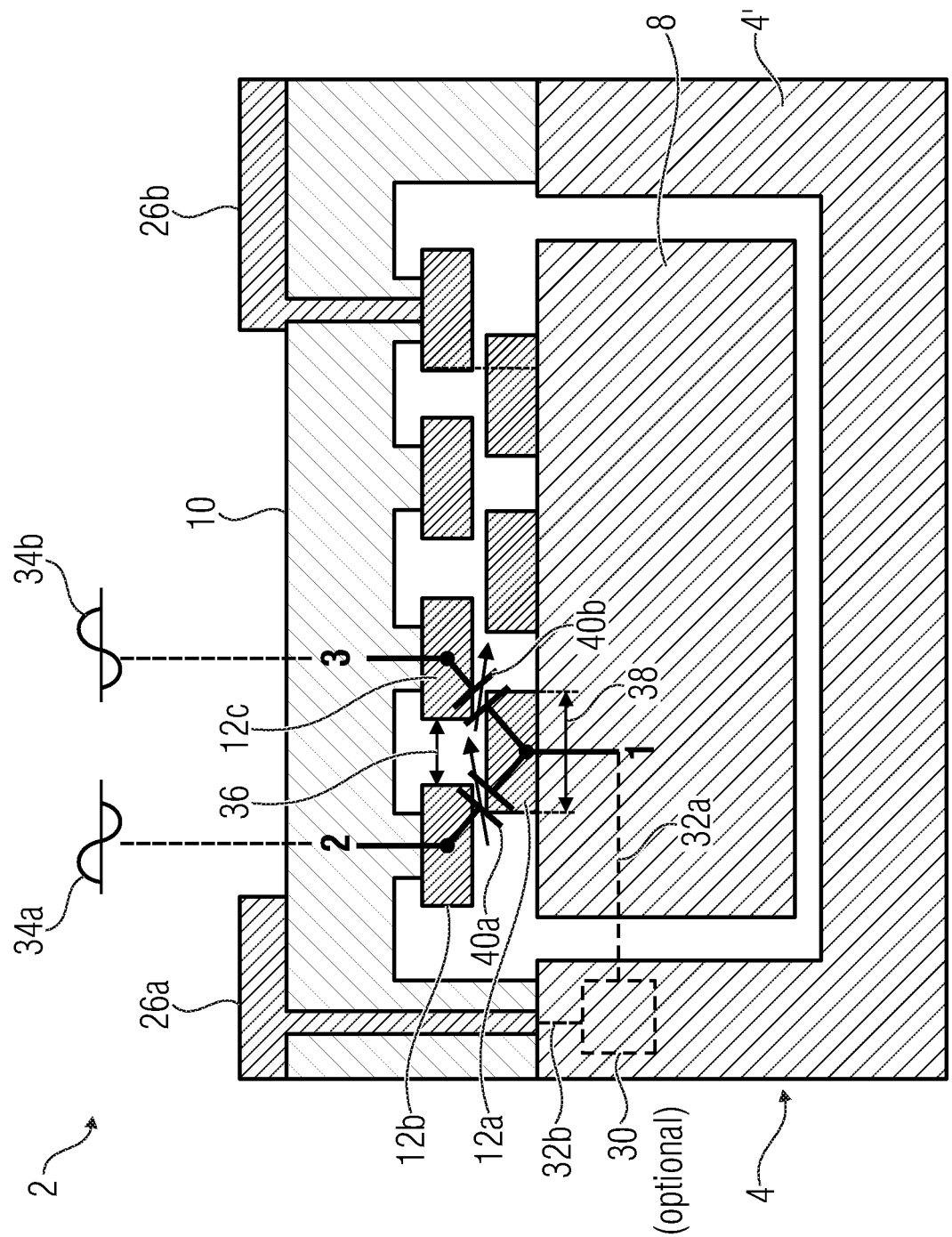
FIG. 5 shows a schematic cross sectional view of the MEMS device according to embodiments revealing a differential electrode arrangement as a robust design.

FIG. 5 shows a schematic cross sectional view of the MEMS device 2 according to embodiments. The embodiments of FIG. 5 differ from the embodiments of FIG. 3 in the number and arrangement of the electrode structures. To be more precise, embodiments of FIG. 5 reveal, besides the first and second electrode structure 12a, 12b, a third electrode structure 12c arranged at the cap structure 10 such that the first electrode structure 12a and the third electrode structure 12c are spaced apart in a direction perpendicular to the main surface area of the bulk semiconductor substrate. Unless otherwise noted, the third electrode structure shows the same features and is manufactured using the same manufacturing steps as the second electrode structure. Thus, the description with respect to the second electrode structure is also applicable to the third electrode structure.

A projection of the second and the third electrode structure 12b, 12c perpendicular to the main surface area 16 may partially overlap with the first electrode structure 12a. Hence, the capacitive structure additionally comprises a third electrode structure 12c. Both, the second and the third electrode structure may form a capacitance with the first electrode structure. Since the second and the third electrode structure may be (reflection) symmetrically arranged, the capacity between the first and the second electrode structure and between the first and the third electrode structure may change reversely if the movably suspended mass is deflected or moves. The capacity between the first and the second electrode structure may also be referred to as first capacitance 40a and the capacity between the first and the third electrode structure may also be referred to as third capacitance 40b.

This enables a differential read out of the capacitive structure via the first electrode structure, indicated by node "1". In other words, having a symmetrical arrangement of the second and third electrode structure with respect to the first electrode structure, an alternating current 34a, 34b applied to the second and the third electrode structure (nodes "2" and "3") having the same magnitude but a phase shift of 180° results in a zero current at the first electrode structure. Once the first electrode structure is deflected, there is no longer a symmetry of the second and third electrode structure with respect to the first electrode structure. Thus, there is a current flow through the first electrode structure. Ideally, the current flow is twice as high as the respective current flow having no differential read out. Furthermore, the differential read out allows for compensating (internal or external) stress, e.g. caused by a temperature change or by an external force, on the cap structure, or more generally, on the MEMS device. Since both, the second and the third electrode structure are affected by the stress, the absolute capacitances between the first and the second electrode structure and between the first and the third electrode structure may be affected. However, both are effected merely by the same amount. Thus, the differential readout is not (or only to a minor extend) effected by stress on the MEMS device.

In other words, FIG. 5 shows a half-bridge of the first and the second capacitance 40a, 40b. A full bridge may be obtained by using a further MEMS device or at least a further capacitive structure in the same device and measuring the capacitance between the first electrode structures of the MEMS device and the further MEMS device or the further capacitive structure.

To perform the differential read out, the second and the third electrode structure may be spaced apart by a gap distance 36, wherein a width 38 of the first electrode structure 12a in a direction of the movement of the movably suspended mass is greater than the sum of the gap distance 36 and a maximum amplitude of the movement of the movably suspended mass. In other words, at the maximum amplitude of the movement of the movably suspended mass, the projection of the first electrode structure perpendicular to the main surface area of the semiconductor substrate should partially remain within the first and the second electrode structure. In this case, the MEMS device remains within the area where a reliable sensing of both, the first and the second capacitance 40a, 40b, is possible.

According to embodiments, the microelectromechanical device 2 comprises a read out circuit 30 to read out the capacitive structure. The read out circuit 30 may be implemented in the semiconductor substrate 4 of the microelectromechanical device 2, in a different area of a wafer the semiconductor substrate 4 is part of or on a separate semiconductor substrate. The read out circuit is applicable to any described embodiment of the microelectromechanical device. The read-out circuit may be connected to the first electrode structure via connection 32a and/or connected to the contact 26a contacting the (remaining portion of the) semiconductor substrate via connection 32b.

With respect to FIG. 5, the read-out circuit is configured to differentially read out the capacitive structure, i.e. the capacitance between the first and the second electrode structure and the capacitance between the first and the third electrode structure. The read out circuit may be connected to the first electrode structure to differentially sense a capacitance between the first and the second electrode structure and a capacitance between the first and the third electrode structure. The capacitance may be an absolute value of the capacity between the first and the second electrode structure and/or between the first and the third electrode structure, or a change of any of these capacities.

Figure 6:
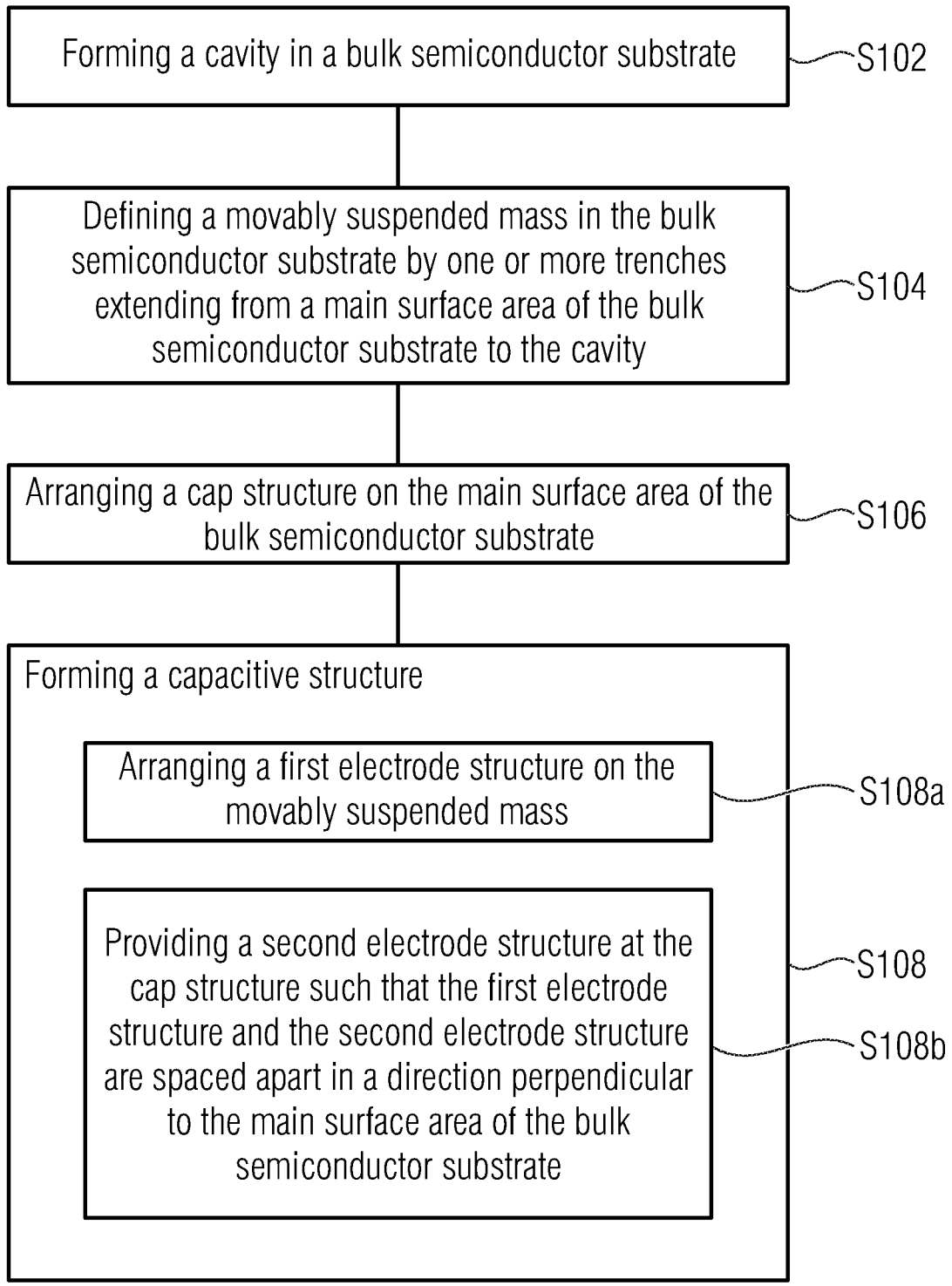
FIG. 6 shows a schematic flow chart of a method for manufacturing the microelectromechanical device.

FIG. 6 shows a schematic flow chart of a method 100 for manufacturing the microelectromechanical device. The method comprises the steps S102, S104, S106, and S108. Step S102 comprises the forming a cavity in a bulk semiconductor substrate. According to embodiments, the cavity may be formed using a silicon-on-nothing process.

The silicon-on-nothing process may also be referred to as an empty space in silicon (ESS) process. A similar or equal process is the Venetia or Venezia process, which was developed (nearly) at the same time. Both processes may be similar, although they may differ in details. However, the Venezia process and the silicon-on-nothing process are mutually applicable. Based on regular silicon wafers, a plurality of trenches may be formed or opened. The trenches may be oxidized after an epitaxial growth. The etching step may be executed selectively or may be extended to all surfaces of a later chip. Oxidized buried channels and cavities which may be obtained inside the semiconductor substrate (e.g. monocrystalline silicon) allow for a manufacturing of cheap substrates, for example, silicon on insulator (SOI) substrates, or for manufacturing (seismic) masses. After having formed the trenches, for example, by applying temperatures of, e.g., more than 1000° C., more than 1100° C. or more than 1200° C. and while applying a hydrogen material, the silicon material may recombine such that the cavity is formed inside the semiconductor substrate. The recombination may comprise an epitaxial growth and/or a doping of the material that recombines. A portion of the semiconductor substrate covering the cavity and being arranged between the cavity and the main surface may form the support structure.

In other words, the silicon on nothing process comprises forming a set of parallel trenches prepared to extend vertically from the main surface area of the semiconductor substrate into the semiconductor substrate. The depth of the trenches may be substantially the same as the desired depth of the cavity beneath the main surface area of the semiconductor substrate. Then, the semiconductor substrate may be subjected to a heat treatment which causes reformation of the upper surface of the semiconductor substrate, thereby filling the upper portions of the trenches while causing merging of the lower portions of the trenches to thereby form the cavity. As a result, the cavity is formed beneath the main surface area of the semiconductor substrate. At this point, the cavity is completely embedded within the single crystal material of the semiconductor substrate.

Step S104 comprises defining a movably suspended mass in the bulk semiconductor substrate by one or more trenches extending from a main surface area of the bulk semiconductor substrate to the cavity. The trenches may be etched using e.g. a wet etching process or a dry etching process such as for example (deep) reactive ion etching ((D)RIE).

Step S106 comprises arranging a cap structure on the main surface area of the bulk semiconductor substrate. The arranging may be performed by depositing a cap structure material on the main surface area and above the movably suspended mass. The cap structure material may not be deposited directly on the seismic mass as not to form a further mechanical connection between the remaining portion of the semiconductor substrate and the movably suspended mass besides the springs.

Step S108 comprises forming a capacitive structure. Step S108 may be performed prior to step S106. Step S108 comprises the sub-steps S108a of arranging a first electrode structure on the movably suspended mass and S108b of providing a second electrode structure at the cap structure such that the first electrode structure and the second electrode structure are spaced apart in a direction perpendicular to the main surface area of the bulk semiconductor substrate. Embodiments of steps S104 to S108 are described with respect to subsequent FIGS. 7a-7e.

The above described steps of method 100 may be further used in a method for manufacturing a system on chip using a CMOS process. The system on chip may comprise a microelectromechanical device and a control circuit to read out the microelectromechanical device. The steps of method 100 may be used to form the microelectromechanical device, wherein at least one step of the steps of method 100 simultaneously performs a step of manufacturing the control circuit. Thus, a half bridge is formed as a system on chip.

To obtain a full bridge, additionally, at least one step of method 100 simultaneously forms a further microelectromechanical device. The control circuit is formed such that it is connected to the first electrode structure of the microelectromechanical device and connected to the first electrode structure of the further microelectromechanical device as to obtain a differential signal between the first and the second microelectromechanical device. Thus, a full bridge is achieved using the MEMS device and the further MEMS device in connection with the suitably formed read out circuit.

In other words, processes used in the CMOS process might also be utilized in the event of system on chip (SoC) integration. The steps that are simultaneously usable may be implantation of the top side of the semiconductor substrate, e.g. to form transistor structures such as n- and/or p-diffusion areas in parallel to contacting the first electrode structure with the remaining semiconductor substrate using doping of the movably suspended mass and the springs. By performing the steps to build the MEMS device may be performed in a MEMS area of the semiconductor substrate wherein the use of the steps to form the control circuit are performed in a CMOS area of the semiconductor substrate. A gate polycrystalline silicon of a transistor structure may be used as the one of the electrode structures, e.g. the first electrode structure. A (metallization) inter layer dielectric (ILD) may be used as the cap structure (or covering layer) of the MEMS device. In other words, the cap structure may be formed from an oxide in parallel to an oxide of an inter layer dielectric.

Figure 7A:
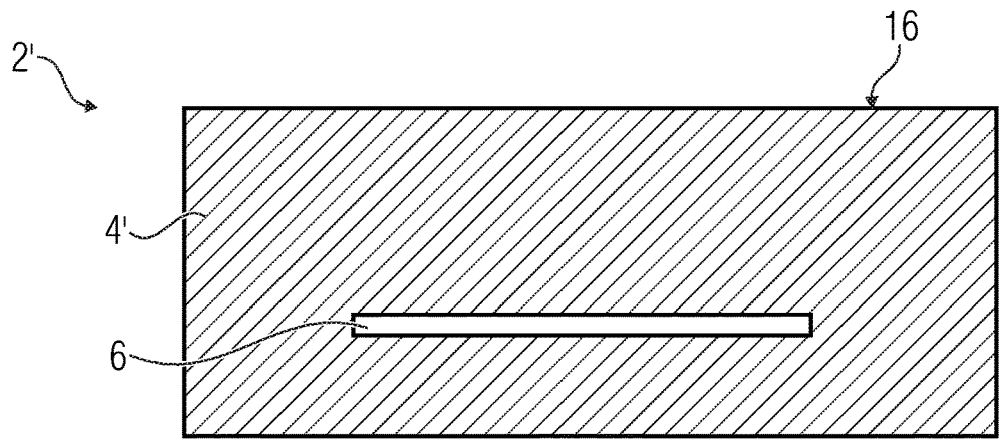
Figure 7B:
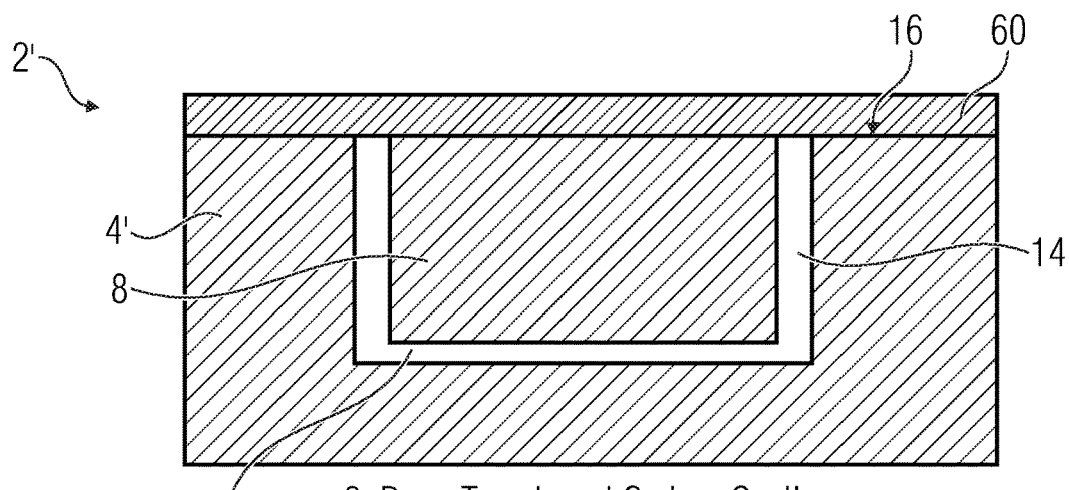
Figure 7C:
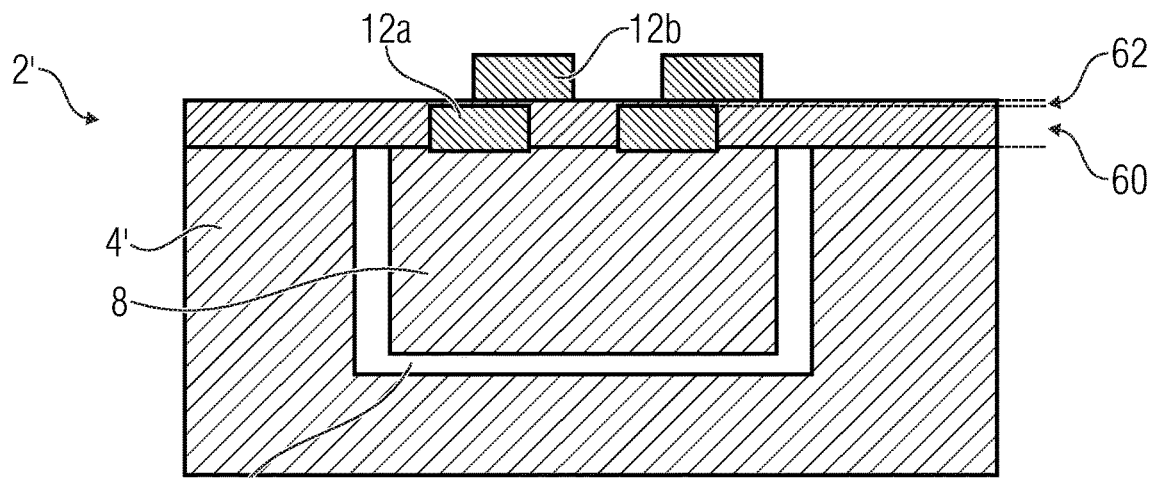
Figure 7D:
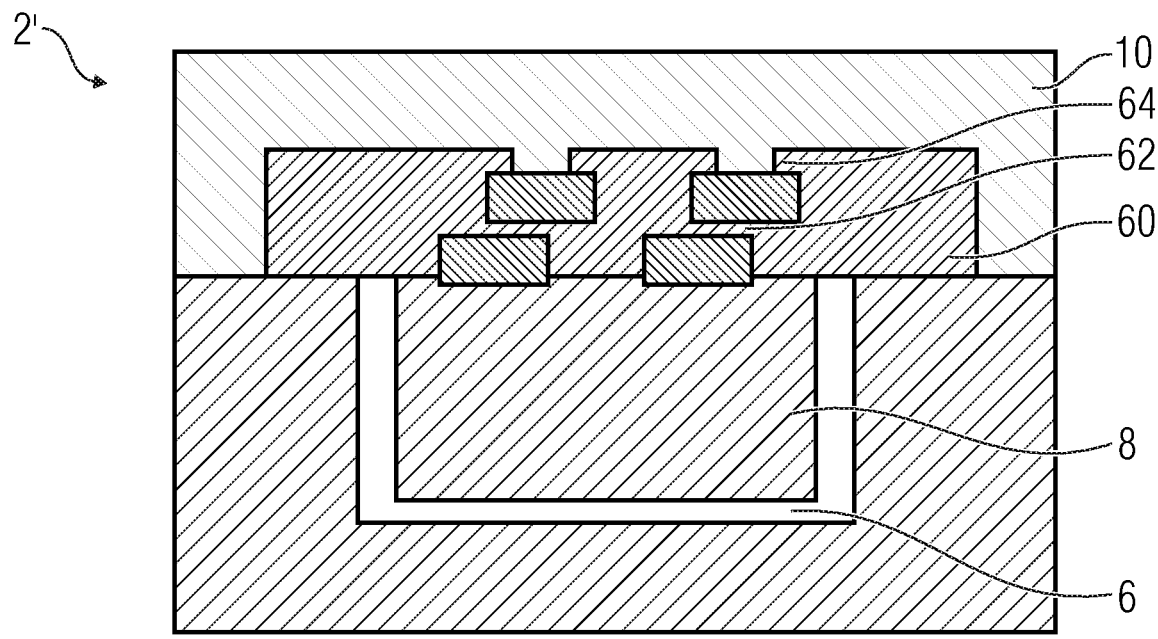
Figure 7E:
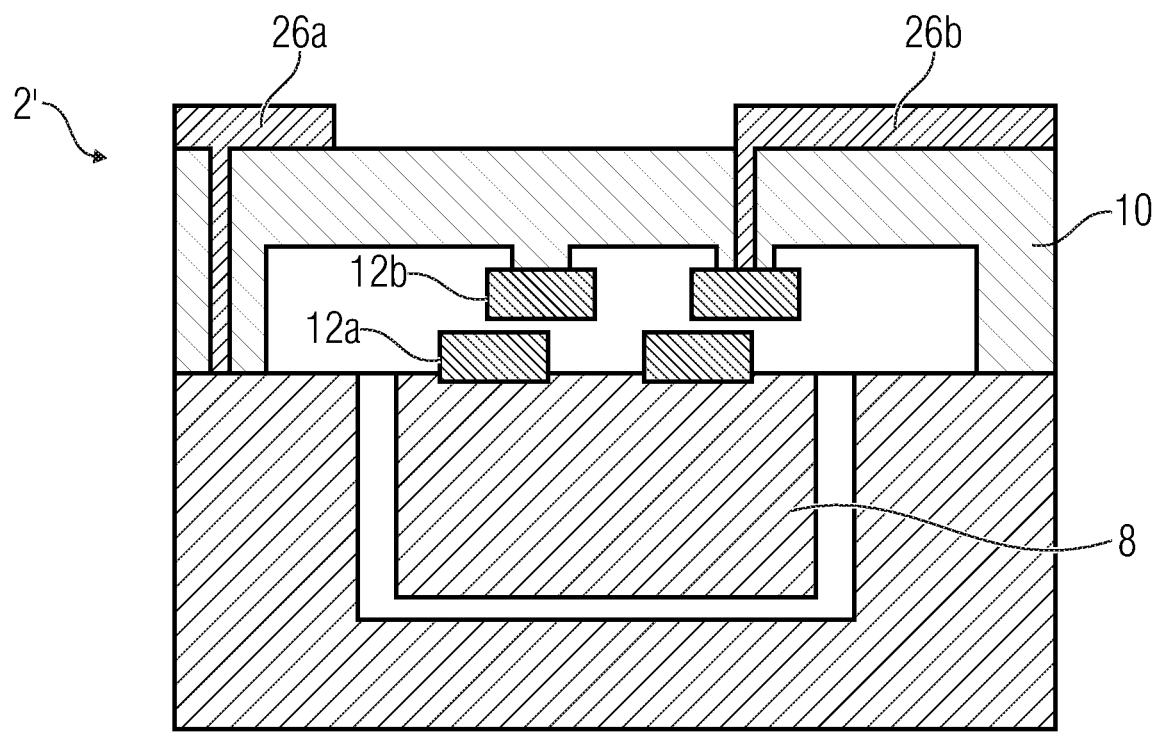

FIG. 7a-7e show in FIG. 7a to FIG. 7d four schematic cross-sectional views of an intermediate MEMS device 2' after 4 processing steps resulting in the final MEMS device 2 shown in FIG. 7e. FIG. 7a shows the intermediate MEMS device after the cavity was formed. The forming may be performed by the silicon on nothing process described above with respect to FIG. 5. Thus, FIG. 7a may relate to step S102.

FIG. 7b reveals the intermediate MEMS device after the movably suspended mass 8 is formed. During step S108a, it may be deposited a sacrificial layer 60 on the main surface area 16 of the bulk semiconductor substrate closing the one or more trenches 14 extending from the main surface area 16 of the bulk semiconductor substrate 4 to the cavity 16. The sacrificial layer (e.g. all sacrificial layers such as the intermediate sacrificial layer and/or the further sacrificial layer described below) may comprise carbon.

FIG. 7c shows the intermediate MEMS device after structuring of the sacrificial layer to obtain a structured sacrificial layer and depositing a first electrode structure material (e.g. polycrystalline silicon) into a structure of the structured sacrificial layer to arrange the first electrode structure 12a on the movably suspended mass 8, that may be also performed during step 108a. Alternatively, and not shown in FIG. 7, the step S108a comprises structuring the bulk semiconductor substrate 4 to form the first electrode structure 12a. This concept is described with respect to FIG. 4. To reduce parasitic capacities, an insulating layer comprising e.g. an oxide may be deposited between the movably suspended mass and the first electrode structure.

Additionally, FIG. 7c reveals the intermediate MEMS device after step 108b is performed. Step S108b may comprise depositing an intermediate sacrificial layer 62 on the first electrode structure 12a to obtain a stack of sacrificial layers. The intermediate sacrificial layer may be thin, e.g. comprise a thickness (or width) of less than 500 nm, less than 400 nm, less than 300 nm, less than 200 nm, less than 100 nm, less than 80 nm, or less than 60 nm. On the intermediate sacrificial layer 62, a second electrode structure material (e.g. polycrystalline silicon) may be deposited. The second electrode structure material may be structured to form a second electrode structure 12b. Having the thin sacrificial layer defining the gap distance between the first and the second electrode structure, the sensitivity of the MEMS device is significantly increased when compared to greater gap distances. Any step regarding the second electrode structure is also applicable to the third electrode structure.

FIG. 7d reveals the intermediate MEMS device 2' during step S106. From FIG. 7c to FIG. 7d, a further sacrificial layer 64 may be deposited on the second electrode structure. The further sacrificial layer may not cover the second electrode structure completely or a trench (or cavity) may be opened or etched from in the further sacrificial layer as to uncover or expose the second electrode structure. Additionally, in step S106, a cap structure material (e.g. an oxide) may be deposited on the second electrode structure (and the further sacrificial layer) and a remaining portion of the semiconductor material, wherein the cap structure material is connected to the second electrode structure. The connection of the cap structure to the remaining portion of the semiconductor substrate may be performed directly (i.e. cap structure material is directly deposited on semiconductor substrate) or indirectly via an intermediate layer between the cap structure material and the semiconductor substrate.

To obtain the MEMS device in FIG. 7e, the stack of sacrificial layers comprising the sacrificial layer, the intermediate sacrificial layer and the further sacrificial layer is removed as to obtain a cap structure having attached the second electrode structure. The removal may be performed by an ashing process using e.g. oxygen. More precisely, the removal may be achieved by a dry process, e.g., by ashing in an oxidizing atmosphere, through holes formed in the cap structure. After removal of the sacrificial layer, the holes may be sealed. Before sealing the holes, the empty space formed by the cavity, the trenches, and the space between the cap structure and the movable suspended mass may be filled with a suitable gas, e.g., nitrogen.

To expose the sacrificial layer, one or more holes may be etched into the cap structure to allow the removal of the sacrificial layer. The holes may be closed to obtain a (hermetically) sealed housing for the electrode structures and the movably suspended mass.

Additionally, step S106 may comprise forming contact elements (or wiring) 12a, 12b through the cap structure 10. This may be performed by etching holes into the cap structure material extending to the semiconductor substrate and the second electrode structure. Both, the second electrode structure and the semiconductor substrate material may provide a suitable etch stop such that, which is at least sufficient to stop the etching prior to (completely) penetrating the second electrode structure. In other words, The holes may be filled with a suitable conductive material such as tungsten or a further metal.

The steps may performed in a CMOS process. Hence, the steps S106 of arranging the cap structure on the main surface area of the bulk semiconductor substrate and/or S108 of forming the capacitive structure may be performed in a back end of line process.

In other words, an a point is to close (seal) the perpendicular trenches with a sacrificial layer (e.g., carbon) in each case, which will be removed again in the area of the lower electrodes (first electrode structure). The electrode material is subsequently deposited and is removed in all of the areas above the sacrificial layers by means of a planarization process (CMP). Thus, the closure of the trenches and the definition of the electrode distance are decoupled from one another. Said electrode distance may then be freely defined via a further deposition of a (intermediate) sacrificial layer. In principle, distances below 100 nm are possible.

In this manner, several advantages are created—the arrangement makes do with a movable mass, which needs to be supplied with a defined potential only on the top side: dielectric insulation from the substrate is not mandatory. Moreover, there are no laterally arranged electrode fingers that would have to be insulated. This simplifies the integration and manufacturing expenditure significantly. The proposed structure is also easier to handle in terms of design and operation—sensitivity to acceleration as well as a large capacitive stroke do not result in a smaller pull-in voltage; in the event of lateral tapping, the electrical field and the direction of movement lie on one axis, which results in the above-mentioned disadvantage such as the comparably great size of the resulting MEMS device. In contrast, embodiments show that the electrical field and the direction of movement lie on different axes, e.g. perpendicular to each other.

In the proposed example, an electrode field is provided within or on the covering layer encapsulating the movable part of the sensor. In addition to the electrode arrangement shown in FIG. 2, a differential arrangement is also suitable. In this case, the advantage consists in the fact that with a wiring that results in a bridge circuit, a change in the electrode distance (e.g., due to temperature-dependent stress in the covering layer or due to pressure exerted by the mold mass) has an equal effect on all of the branches of the bridge and therefore does not contribute to signal distortion. A suitable arrangement is outlined in FIG. 5.

In embodiments, e.g. depicted in FIG. 5, the electrode arrangement is selected such that the upper electrodes overlap two electrodes located at the bottom, respectively. In this manner, an AC half bridge may readily be implemented, which may then be also integrated as a full bridge while involving further elements.

According to a first aspect, a microelectromechanical device comprises a bulk semiconductor substrate, a cavity formed in the bulk semiconductor substrate, a movably suspended mass defined in the bulk semiconductor substrate by one or more trenches extending from a main surface area of the bulk semiconductor substrate to the cavity, a cap structure arranged on the main surface area of the bulk semiconductor substrate; and a capacitive structure comprising a first electrode structure arranged on the movably suspended mass and a second electrode structure arranged at the cap structure such that the first electrode structure and the second electrode structure are spaced apart in a direction perpendicular to the main surface area of the bulk semiconductor substrate.

According to a second aspect when referring back to the first aspect, the first electrode structure is laterally displaced with respect to the second electrode structure.

According to a third aspect when referring back to the first aspect the first electrode structure comprises an electrode structure material, the bulk semiconductor substrate comprises a semiconductor substrate material, and the electrode structure material comprises a material structure different from a material structure of the semiconductor substrate material.

According to a fourth aspect when referring back to the first aspect, the first electrode structure comprises a first electrode structure material, the second electrode structure comprises a second electrode structure material and the first electrode structure material comprises a structure different from a material structure of the second electrode structure material.

According to a fifth aspect when referring back to the first aspect, a projection of the second electrode structure perpendicular to the main surface area of the bulk semiconductor substrate partially overlaps with the first electrode structure.

According to a sixth aspect when referring back to the first aspect, a third electrode structure arranged at the cap structure such that the first electrode structure and the third electrode structure are spaced apart in a direction perpendicular to the main surface area of the bulk semiconductor substrate.

According to a seventh aspect when referring back to the sixth, aspect a projection of the second and the third electrode structure perpendicular to the main surface area partially overlaps with the first electrode structure.

According to an eighth aspect when referring back to the seventh aspect, the read out circuit is connected to the first electrode structure to differentially sense a capacitance between the first and the second electrode structure and a capacitance between the first and the third electrode structure.

According to a ninth aspect when referring back to the sixth, the second and the third electrode structure are spaced apart by a gap distance, wherein a width of the first electrode structure in a direction of the movement of the movably suspended mass is greater than the sum of the gap distance and a maximum amplitude of the movement of the movably suspended mass.

According to a tenth aspect when referring back to the first aspect, the movably suspended mass is configured to move in a direction parallel to the main surface area of the bulk semiconductor substrate.

According to an eleventh aspect when referring back to the first aspect, the first and the second electrode structure are spaced apart by a distance of less than 500 nm, less than 400 nm, less than 300 nm, less than 200 nm, less than 100 nm, less than 80 nm, or less than 60 nm.

According to a twelfth aspect when referring back to the first aspect, the cap structure is configured to seal the movably suspended mass, the first and the second electrode structure.

According to a thirteenth aspect when referring back to the first aspect the movably suspended mass is connected to a remaining portion of the bulk semiconductor substrate by spring elements, wherein the first electrode structure comprises an electrical connection to the remaining portion of the bulk semiconductor substrate via the spring elements.

According to a fourteenth aspect, a method for manufacturing a microelectromechanical device comprises the following steps: forming a cavity in a bulk semiconductor substrate; defining a movably suspended mass in the bulk semiconductor substrate by one or more trenches extending from a main surface area of the bulk semiconductor substrate to the cavity; arranging a cap structure on the main surface area of the bulk semiconductor substrate; forming a capacitive structure comprising: arranging a first electrode structure on the movably suspended mass, and providing a second electrode structure at the cap structure such that the first electrode structure and the second electrode structure are spaced apart in a direction perpendicular to the main surface area of the bulk semiconductor substrate.

According to a fifteenth aspect when referring back to the fourteenth aspect, the step of forming the cavity in the bulk semiconductor substrate is performed by a silicon-on-nothing process.

According to a sixteenth aspect when referring back to the fourteenth aspect, the method comprises depositing a sacrificial layer on the main surface area of the bulk semiconductor substrate closing the one or more trenches extending from the main surface area of the bulk semiconductor substrate to the cavity; structuring the sacrificial layer to obtain a structured sacrificial layer; and depositing a first electrode structure material into a structure of the structured sacrificial layer to arrange the first electrode structure on the movably suspended mass.

According to a seventeenth aspect when referring back to the fourteenth aspect, the method comprises structuring the bulk semiconductor substrate to form the first electrode structure.

According to an eighteenth aspect when referring back to the sixteenth aspect, the method comprises depositing an intermediate sacrificial layer on the first electrode structure to obtain a stack of sacrificial layers; depositing a second electrode structure material on the intermediate sacrificial layer; and structuring the second electrode structure material to form a second electrode structure.

According to a nineteenth aspect when referring back to the eighteenth aspect, the method comprises depositing a cap structure material on the second electrode structure and a remaining portion of the semiconductor material, wherein the cap structure material is connected to the second electrode structure; and removing the stack of sacrificial layers as to obtain a cap structure having attached the second electrode structure.

According to a twentieth aspect when referring back to the nineteenth aspect, the steps are performed in a CMOS process and wherein the cap structure is formed from an oxide in parallel to an oxide of an interlayer dielectric.

According to a twenty-first aspect when referring back to the fourteenth aspect, the steps of arranging the cap structure on the main surface area of the bulk semiconductor substrate and/or forming the capacitive structure are performed in a back end of line process.

According to a twenty-second aspect, a method for manufacturing a system on chip using a CMOS process, wherein the system on chip comprises a microelectromechanical device and a control circuit to read out the microelectromechanical device, comprises the steps of any of aspects 14 to 21 to form the microelectromechanical device, wherein at least one step of the steps of any of aspects 14 to 21 simultaneously perform a step of manufacturing the control circuit.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A microelectromechanical systems (MEMS) device comprising:
   bulk semiconductor substrate;
   a cavity formed in the bulk semiconductor substrate;
   a movably suspended mass defined in the bulk semiconductor substrate by one or more trenches extending from a main surface area of the bulk semiconductor substrate into the cavity;
   a cap structure arranged on the main surface area of the bulk semiconductor substrate;
   a first capacitive structure comprising:
      a first electrode structure arranged on the movably suspended mass; and
      a second electrode structure arranged at the cap structure such that the first electrode structure and the second electrode structure are spaced apart in a first direction perpendicular to the main surface area of the bulk semiconductor substrate; and
   spring elements connected to and between the movably suspended mass and the bulk semiconductor substrate such that the movably suspended mass is suspended from the bulk semiconductor substrate within the cavity via the spring elements,
   wherein the spring elements comprise an electrical connection configured to electrically connect the first electrode structure to the bulk semiconductor substrate.

2. The MEMS device according to claim 1, wherein the first electrode structure is laterally displaced with respect to the second electrode structure.

3. The MEMS device according to claim 1, wherein:
   the first electrode structure comprises an electrode structure material;
   the bulk semiconductor substrate comprises a semiconductor substrate material; and
   the electrode structure material comprises a material structure different from a material structure of the semiconductor substrate material.

4. The MEMS device according to claim 1, wherein:
   the first electrode structure comprises a first electrode structure material;
   the second electrode structure comprises a second electrode structure material; and
   the first electrode structure comprises a material structure different from a material structure of the second electrode structure material.

5. The MEMS device according to claim 1, wherein:
   the main surface area extends in a second direction orthogonal to the first direction,
   the first electrode structure and the second electrode structure are offset from each other in the second direction such that a first portion of the first electrode structure overlaps with a first portion of the second electrode structure in the first direction, a second portion of the first electrode structure does not overlap with the second electrode structure in the first direction, and a second portion of the second electrode structure does not overlap with the first electrode structure in the first direction.

6. The MEMS device according to claim 1, further comprising a second capacitive structure, comprising:
   the first electrode structure arranged on the movably suspended mass; and
   a third electrode structure arranged at the cap structure adjacent to the second electrode structure, wherein the first electrode structure and the third electrode structure are spaced apart in the first direction perpendicular to the main surface area of the bulk semiconductor substrate.

7. The MEMS device according to claim 6, wherein:
   the main surface area extends in a second direction orthogonal to the first direction,
   the first electrode structure and the second electrode structure are offset from each other in the second direction such that a first portion of the first electrode structure overlaps with a first portion of the second electrode structure in the first direction, a second portion of the first electrode structure does not overlap with the second electrode structure in the first direction, and a second portion of the second electrode structure does not overlap with the first electrode structure in the first direction, and
   the first electrode structure and the third electrode structure are offset from each other in the second direction such that the second portion of the first electrode overlaps with a first portion of the third electrode structure in the first direction, and a second portion of the third electrode structure does not overlap with the first electrode structure in the first direction.

8. The MEMS device according to claim 7, wherein a read out circuit is connected to the first electrode structure to differentially sense a capacitance between the first electrode structure and the second electrode structure and a capacitance between the first electrode structure and the third electrode structure.

9. The MEMS device according to claim 6, wherein the second electrode structure and the third electrode structure are spaced apart by a gap distance, wherein a width of the first electrode structure in a direction of movement of the movably suspended mass is greater than a sum of the gap distance and a maximum amplitude of the movement of the movably suspended mass.

10. The MEMS device according to claim 1, wherein the movably suspended mass is configured to move in a direction parallel to the main surface area of the bulk semiconductor substrate.

11. The MEMS device according to claim 1, wherein the first electrode structure and the second electrode structure are spaced apart by a distance of less than 500 nm.

12. The MEMS device according to claim 1, wherein the cap structure is configured to seal the movably suspended mass, the first electrode structure, and the second electrode structure within an interior region defined between the cap structure and the bulk semiconductor substrate.

13. The MEMS device according to claim 1, wherein the bulk semiconductor substrate, the movably suspended mass, and the spring elements form a unitary structure made of a semiconductor material.

14. The MEMS device according to claim 5, wherein the cap structure is configured to seal the movably suspended mass, the first electrode structure, and the second electrode structure within an interior region defined between the cap structure and the bulk semiconductor substrate.

15. The MEMS device according to claim 6, wherein the cap structure is configured to seal the movably suspended mass, the first electrode structure, the second electrode structure, and the third electrode structure within an interior region defined between the cap structure and the bulk semiconductor substrate.

16. The MEMS device according to claim 7, wherein the cap structure is configured to seal the movably suspended mass, the first electrode structure, the second electrode structure, and the third electrode structure within an interior region defined between the cap structure and the bulk semiconductor substrate.

17. The MEMS device according to claim 7, further comprising:
- a fourth electrode structure arranged on the movably suspended mass, wherein the fourth electrode and the second portion of the third electrode structure are spaced apart and overlap in the first direction perpendicular to the main surface area of the bulk semiconductor substrate.

18. The MEMS device according to claim 17, wherein the cap structure is configured to seal the movably suspended mass, the first electrode structure, the second electrode structure, the third electrode structure, and the fourth electrode structure within an interior region defined between the cap structure and the bulk semiconductor substrate.

\* \* \* \* \*